(12) United States Patent
Hancu

(10) Patent No.: US 7,375,523 B1
(45) Date of Patent: May 20, 2008

(54) SYSTEM AND METHOD FOR FAST MR COIL SENSITIVITY MAPPING

(75) Inventor: Ileana Hancu, Clifton Park, NY (US)

(73) Assignee: General Electric Company, Niskayuna, NY (US)

(*) Notice: Subject to any disclaimer, the term of this patent is extended or adjusted under 35 U.S.C. 154(b) by 0 days.

(21) Appl. No.: 11/554,516

(22) Filed: Oct. 30, 2006

(51) Int. Cl.
*G01V 3/00* (2006.01)

(52) U.S. Cl. ........................ 324/307; 324/318

(58) Field of Classification Search ........ 324/300–322; 600/407–445
See application file for complete search history.

(56) References Cited

U.S. PATENT DOCUMENTS

| | | | | |
|---|---|---|---|---|
| 5,910,728 | A | * | 6/1999 | Sodickson ................ 324/309 |
| 6,728,404 | B1 | * | 4/2004 | Ono et al. ................ 382/190 |
| 6,949,928 | B2 | * | 9/2005 | Gonzalez Ballester et al. ........................ 324/307 |

OTHER PUBLICATIONS

T. M. Mitchell, "Artificial Neural Networks," Machine Learning, Ch. 4, pp. 81-127.
R. Stollberger & P. Wach, "Imaging of the Active B1 Field In Vivo," MRM, 35:246-251 (1996).
U. Sinha & H. Kangarloo, "Principal Component Analysis for Content-based Image Retrieval," RadioGraphics, 22:1271-1289 (2002).

* cited by examiner

*Primary Examiner*—Brij Shrivastav
(74) *Attorney, Agent, or Firm*—Jason K. Klindtworth; Curtis B. Brueske

(57) ABSTRACT

A system and method for mapping the sensitivity of MR coils includes a neural network or other computer intelligence trained from sample MR data to determine coil sensitivity profiles or sensitivity normalizations. Once the network is trained, subsequent coil mapping determinations may include fewer mapping acquisitions per coil. The resulting sensitivity map can be used in compensating for B1 inhomogeneities, parallel imaging reconstruction, generating tailored excitation currents for each individual coil, RF shimming, or other processes.

25 Claims, 4 Drawing Sheets

SYSTEM AND METHOD FOR FAST MR COIL SENSITIVITY MAPPING

BACKGROUND OF THE INVENTION

The present invention relates generally to magnetic resonance imaging, and more specifically, to a system and method for mapping the sensitivity of radio frequency (RF) coils of a magnetic resonance (MR) system. The invention finds particular utility in parallel imaging applications by providing quickly determined coil sensitivity maps, requiring fewer flip angles/scans to determine.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Often, it is desirable in MR imaging procedures to map the strength and variations in a B1 magnetic field across the desired field of view, to decrease the potential effects on image reconstruction, or to allow for tailored excitation profiles across the field of view by manipulating individual currents in surface coils. Normalization or compensation functions can be generated from B1 maps and applied to the received NMR signals to account for magnetic field in-homogeneities. The same B1 maps can be used to extract information for driving the currents in individual RF coils in the transmit mode to achieve tailored excitations across the field of view. These mappings are usually performed for each scan subject, as subject positioning within the coil and subject-specific local physical properties (such as dielectric constant) can influence the coil B1 homogeneity.

Methods for mapping the sensitivity of RF coils, or alternatively the uniformity of the B1 field, typically require that multiple data acquisitions take place for each coil of an RF coil assembly, where each data acquisition is taken at a different flip angle. This typically results in the use of 2-8 different flip angles or transmit powers for each coil of an N-channel coil array. Therefore, a total of 2N-8N different acquisitions are often used to generate one sensitivity mapping. The signals acquired in these acquisitions are proportional to the sine of the flip angle. Therefore, a pixel by pixel fit of the intensity of the signal versus the flip angle (from the known RF pulse height or width) can produce a map of the coil sensitivity. This method of coil sensitivity mapping is well known in the art. However, as the number of calibration or sensitivity-measuring scans required to produce this pixel by pixel fit is increased, overall scan time and patient throughput decrease.

One particular application where coil sensitivity mapping is particularly advantageous is parallel imaging. Usually the system of spins is excited using a homogeneous coil (such as a whole-body RF coil), and then an array of surface RF coils is used to receive the MR signals, in order to increase the step size between phase-encoding lines, or equivalently to reduce the size of the field of view and the amount of data collected. Scan time reduction is achieved by under-sampling k-space and recording images simultaneously from the multiple imaging or receive coils. Under-sampling generally reduces the data acquisition time by increasing the distance of sampling positions in k-space.

Parallel imaging techniques not only expedite data acquisition, but also reduce aliasing or wrapping that occurs in the phase-encoding direction when an imaging object extends outside a field-of-view (FOV). In particular, parallel imaging techniques remove or reduce the aliasing by using surface coil $B_1$ fields (sensitivities), to define or determine an un-aliased spin distribution. Information regarding the surface coil $B_1$ fields or sensitivities is typically acquired with an external calibration or a self-calibration technique. Generally, the coil sensitivity data is used to weight the imaging data such that coil sensitivity is reflected in the reconstructed image, and, as a result, the coil sensitivity data reduces aliasing in the reconstructed image that can occur as a result of under-sampling.

In a manner similar to that previously described, an array of RF coils can also be used to both transmit and receive the MR signals (as opposed to using a homogenous RF coil for transmitting and many surface coils for receiving the signal). Such an approach has been shown to be useful for RF shimming, pulse designs for small FOV imaging, or reducing specific absorption rate for certain other MR applications. For these applications, methods of pulse design typically rely on knowledge of the particular excitation and reception pattern of each of the small RF coils employed.

In all these applications, the time spent determining coil sensitivity should be as little as possible. It would therefore be desirable to have a system and method capable of quickly producing coil sensitivity maps while requiring a reduced number of mapping acquisitions.

BRIEF DESCRIPTION OF THE INVENTION

The present invention provides for rapid coil sensitivity mapping for MR systems using computer-developed normalization or weighting functions. Neural networks or similar computer intelligence are exemplary techniques employed to generate the weighting functions, further allowing computers to construct coil sensitivity profiles for each coil of an RF coil assembly with minimal input data.

Therefore, in accordance with one aspect of the invention, an MRI system includes a plurality of gradient coils positioned about a bore of a magnet to impress a polarizing magnetic field, an RF coil assembly, a system control, and an image processing unit. The RF coil assembly is connected to emit RF pulse sequences and is arranged to receive MR data from a subject within the bore. The system control is configured to develop a coil sensitivity mapping function from sample sets of MR data and generate a given coil sensitivity map. The image processing unit is configured to apply the given coil sensitivity map in an MR imaging procedure.

In accordance with another aspect of the invention, the invention is embodied in a method for sensitivity mapping of RF coils. The method includes training a neural network to determine coil sensitivity profiles, acquiring MR mapping data at a given transmit power and with a given RF pulse characteristic for each of a plurality of coils of an MR system, and inputting the MR mapping data to the neural network to obtain a coil sensitivity profile for each of the plurality of coils.

In accordance with a further aspect of the invention, a coil sensitivity map generator is disclosed. The generator includes a processing unit programmed to operate a neural network to produce B1 maps, a training data interface connected to receive sample MR data and input the sample MR data to train the neural network, and a data acquisition unit configured to acquire MR mapping signals from each coil of an RF coil assembly and transmit the signals to the neural network.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
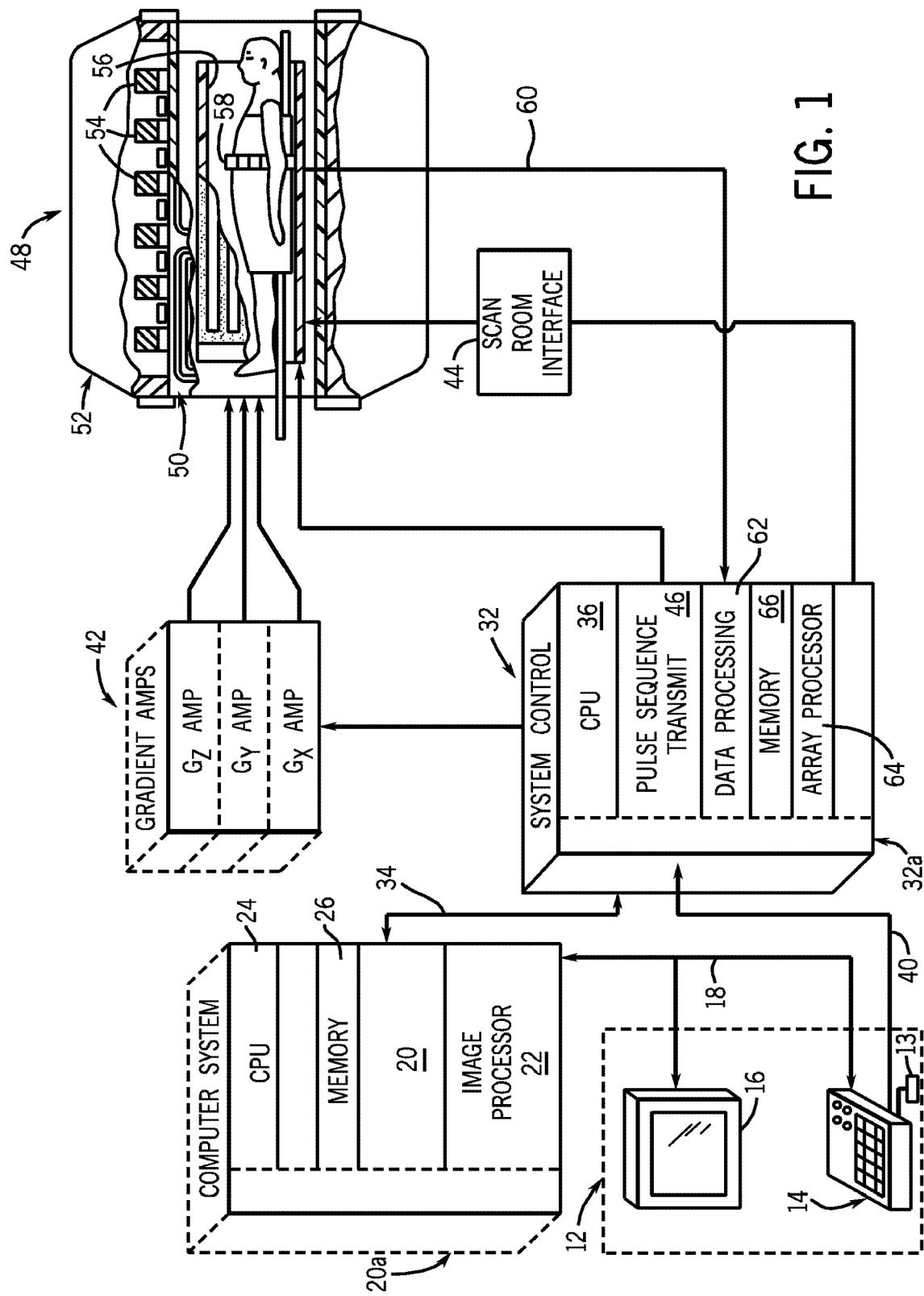
FIG. 1 is a schematic block diagram of an MR imaging system incorporating the present invention.

Referring to FIG. 1, the major components of an example magnetic resonance imaging (MRI) system incorporating the present invention are shown. The operation of the system may be controlled from an operator console 12 which includes a keyboard or other input device 13, a control panel 14, and a display screen 16. The input device 13 can include a mouse, keyboard, track ball, touch activated screen, light wand, or any similar or equivalent input device, and may be used for interactive geometry prescription. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 may also be connected to permanent or back-up memory storage, a network, or may communicate with a separate system control 32 through a high speed serial link 34.

The system control 32 includes a set of modules connected together by a backplane 32a and connected to the operator console 12 through a serial link 40. It is through link 40 that the system control 32 receives commands from the operator to indicate the scan sequence that is to be performed. The pulse sequence transmit module 46 commands the scanner components to carry out the desired scan sequence, by sending instructions, commands, and/or requests describing the timing, strength and shape of the RF pulses and pulse sequences to be produced, to correspond to the timing and length of the data acquisition window. The system control 32 also connects to a set of gradient amplifiers 42, to indicate the timing and shape of the gradient pulses that are produced during the scan. The system control 32 may also receive patient data from a scan room interface 44, which may relate data from a user or from a number of different sensors connected to the patient, such as ECG signals from electrodes attached to the patient.

The gradient waveform instructions produced by system control 32 are sent to the gradient amplifier system 42 having Gx, Gy, and Gz amplifiers. Amplifiers 42 may be external of scanner 48, or may be integrated therein. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and an RF coil assembly 56, 58. RF coil assembly may include a whole-body RF transmit coil 56, surface or parallel imaging coils 58, or both. The coils 56, 58 of the RF coil assembly may be configured for both transmitting and receiving, or for transmit-only or receive-only. A pulse generator (not shown) integrated into the scanner equipment 48 produces RF pulses in accordance with the instructions of the pulse sequence transmit module 46 which are amplified and coupled to the RF coil 56 for transmission. Alternatively, RF transmit coil 56 may be replaced or augmented with surface and/or parallel transmit coils, such as coil 58. Similarly, the resulting signals emitted by the excited nuclei in the patient may be sensed by separate receive coils, such as parallel coils or surface coils 58, and are then sent over a data link 60. The MR signals are demodulated, filtered, and digitized in the data processing section 62 of the system control 32.

A scan is complete when an array of raw k-space data has been acquired in the memory module 66. This raw k-space data is rearranged into separate k-space data arrays for each image to be reconstructed, and each of these is input to an array processor 64 which operates to Fourier transform the data into an array of image data. This image data is conveyed through the serial link 34 to the computer system 20 where it is stored in memory 26. In response to commands received from the operator console 12, this image data may be archived in long term storage or may be further processed by the image processor 22 and conveyed to the operator console 12 and presented on the display 16.

In applications such as parallel imaging, RF shimming, reducing specific absorption rates, or narrow FOV imaging, it will be desirable to map the sensitivity and uniformity (or non-uniformity) of parallel or surface coils 58. This sensitivity map may then be used by system control 32 or computer system 20 in subsequent data acquisition, processing or image reconstruction to normalize the signal outputs of coils 58, or otherwise account for field inhomogeneities, or to generate individualized or tailored excitation profiles which have particular characteristics, such as for narrow FOV imaging or controlling specific absorption rates.

Figure 2:
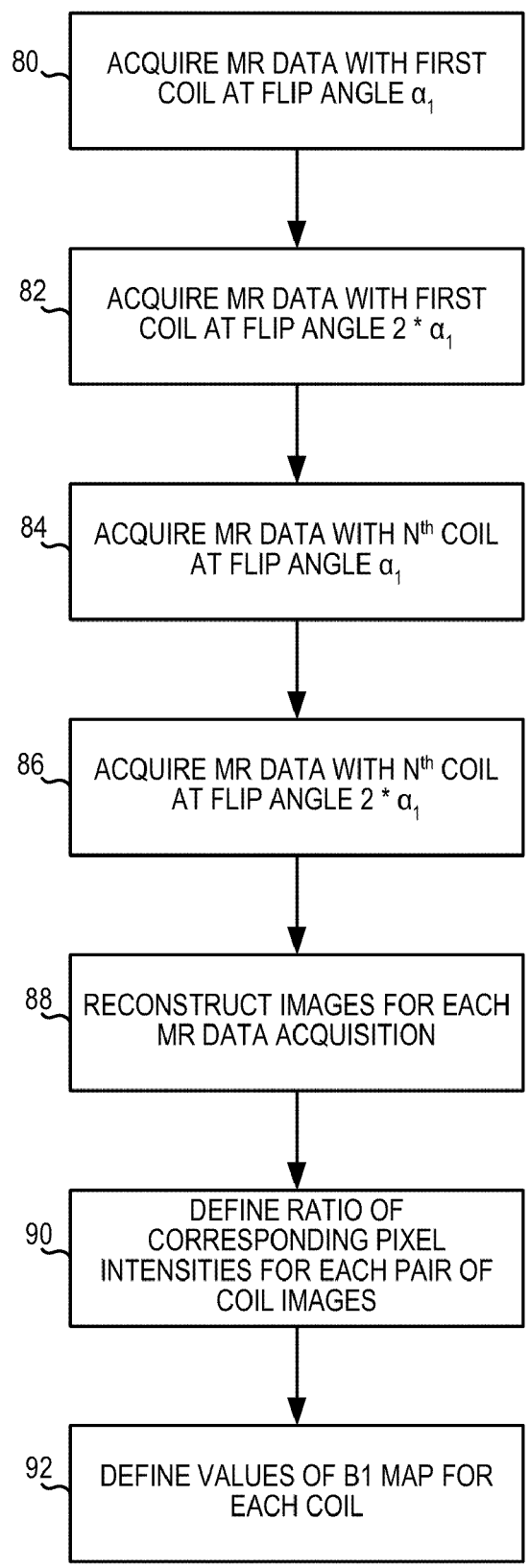
FIG. 2 is a flowchart representing an exemplary sensitivity mapping technique.

One particular way to determine coil sensitivity maps is illustrated in the flowchart of FIG. 2. It should be noted, however, that the techniques described herein and depicted in FIG. 2 are merely exemplary, and that other known coil sensitivity mapping techniques may equivalently be substituted for or combined with the following examples. The technique of FIG. 2 begins with MR signals being acquired 80 for one coil using an RF pulse at a first flip angle $\alpha_1$. Using the same coil, an additional set of MR data is acquired 82 using an RF pulse at the same transit gain, but with a second flip angle $\alpha_2$ which is $2*\alpha_1$. The flip angle may be doubled by altering a pulse width or amplitude of the RF excitation pulse. Alternatively, the second applied flip angle $\alpha_2$ may be half of the first flip angle, or some other proportion which lends to a determination of actual flip angle, as described below. This process of MR data acquisition is repeated for each of the N coils of a multi-channel array, such as a surface coil array. Thus, each subsequent coil is individually controlled to acquire a first set of MR data 84 at the same transmit gain with flip angle $\alpha_1$, and a second set of MR data is acquired 86 at the same transmit gain but with a flip angle $2*\alpha_1$. From the two sets of MR data acquired for all coils of the RF coil assembly, two images may be reconstructed 88.

Since the intensity of the pixels of a reconstructed image is generally proportional to $\sin(\alpha)$, the ratio of the intensity of the two images reconstructed from one coil will be proportional to $\cos(\alpha)$, as the relation between the two applied flip angles, $\alpha_2 = 2*\alpha_1$, is known. Therefore, this ratio of intensities may be expressed 90 for each pixel of the two images for each coil as $I_2/2*I_1$, where $I_2$ is the set of pixel intensities for the second image acquired with $\alpha_2$ and $I_1$ is the set of pixel intensities for the first image acquired with $\alpha_1$. This ratio is independent of spin density and transversal relaxation time. A measure of the actual flip angle generated by each coil can be evaluated 92 as $\alpha = \arccos(I_2/2*I_1)$ for each pixel intensity of the two images of each coil. It is this pixel by pixel evaluation which produces a sensitivity map as a spatial distribution or matrix of apparent/actual flip angles.

In the more general case (i.e. when acquisitions with more than two flip angles are used or when the flip angles are not related by a factor of 2), a pixel by pixel fit of image intensity versus transmit power can generate a spatial map of flip angles produced by each coil at each location in space. The number of flip angles i used to acquire sets of MR data with each coil may depend upon the degree of B1 inhomogeneity or the desired precision in coil sensitivity determination. Thus, a set of i images can be reconstructed for each coil, corresponding to the i flip angles applied, $\alpha_1, \alpha_2, \ldots \alpha_i$. And, for each coil, a table of image intensities will exist, $I_1$, $I_2, \ldots I_i$. Through fitting processes, a maximum image intensity parameter and an actual flip angle parameter can be fit to the data sets of applied flip angles and actual image intensities. Once a fit of these data points has produced an intensity parameter and a flip angle parameter, coil sensitivity maps can be determined as distributions of the flip angle parameters across the desired field of view.

The present invention utilizes neural networks, or other forms of computer intelligence, to ultimately produce coil sensitivity maps faster than the techniques described above with respect to FIG. 2. Neural networks operate by managing the coefficients of a weighting function that converts a set of inputs into a set of outputs. Neural networks "learn" (or are trained) by adjusting the values of the weighting function in accordance with complete data sets of sample inputs and target outputs. The weighting function is often represented as a hidden logic level between the inputs and outputs of the system. Usually, each node of a hidden level reads all input values, multiplies by various weights or coefficients, and produces one or more output values. The initial stage during which a neural network tunes its weighting function to consistently fit sets of sample inputs and target outputs is commonly referred to as the training stage. Once trained, neural networks can be used to rapidly produce outputs based on a limited subset of real input data.

One method for updating or adjusting the weights of the hidden level, or weighting function, is known as back-propagation. An arbitrary set of weights is given to each node of the hidden level, and a weight adjustment increment is set. When a sample set of inputs is presented, the arbitrary weighting function produces a set of outputs. These outputs are compared to a set of target outputs to determine how the weights must be adjusted or tuned to produce a better fit of the target outputs. After multiple sets of sample inputs and target outputs have been fed to the neural network, the weights will eventually become tuned to consistently produce an accurate fit or prediction of the target outputs.

An exemplary weight adjustment function for each given node of a hidden level is given by:

$$o(\vec{x}) = \vec{w} \cdot \vec{x} \qquad \text{Eqn. 1}$$

where $o(x)$ is a vector of one or more outputs of the given hidden node, determined as weight vector w multiplied by input vector x. During training, each given hidden node will determine the error E (as a function of the weight vector w) between its computed output $o_d$ and the target output $t_d$ for each training sample set of inputs and outputs d of a dataset of training examples D by:

$$E(\vec{w}) = \frac{1}{2} \sum_{d \in D} (t_d - o_d)^2 \qquad \text{Eqn. 2}$$

An exemplary back-propagation weight-adjustment function, based on the determined error E between computed and target outputs can be described as:

$$\Delta w_{ji} = -\eta \frac{\partial E_d}{\partial w_{ji}} = \eta(t_j - o_j)o_j(1 - o_j)x_{ji} \qquad \text{Eqn. 3}$$

where $\Delta w_{ji}$ is the change in the weighting coefficient associated with the ith input to hidden unit j, $\eta$ is the chosen weight adjustment increment (such as 0.001, for example), $t_j$ is the target output for unit j, $o_j$ is the computed output of unit j, and $x_{ji}$ is the ith training input value to hidden unit j. Such a function is generally described as being a gradient descent-based algorithm (i.e. it "descends" through a hypothesis space of potential weight functions), and may be further manipulated to take into account such things as momentum (varying $\eta$ based on the degree of error E), thresholded output values, dynamic hidden layers, stopping algorithms, and local-minima compensation algorithms (to overcome false indications of optimization based upon local minima of hypothesis space). In sum, one of ordinary skill in the art will appreciate that the weight-adjustment function and other features of a neural network used in accordance with the present invention may take many forms and variations.

Figure 3:
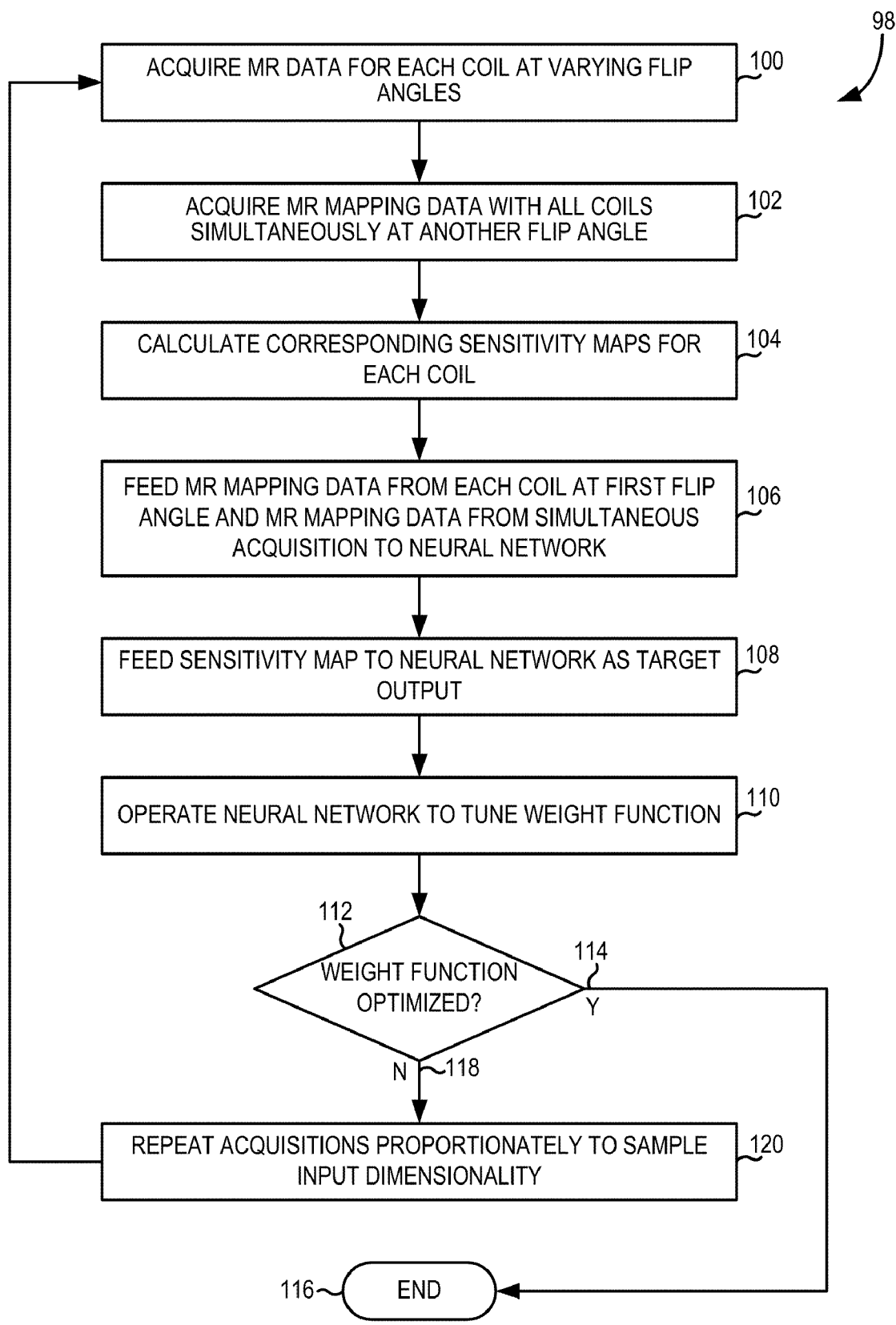
FIG. 3 is a flowchart representing a training technique in accordance with the present invention.

Referring now to FIG. 3, a training technique 98 of the present invention, preferably incorporating the use of a neural network, is shown in flowchart form. Technique 98 begins with the acquisition of MR mapping data for each coil of an RF coil assembly 100. MR mapping data is acquired multiple times for each coil, at varying flip angles. This may be performed in a manner similar to that shown in FIG. 2. In addition, MR mapping data may be acquired with all coils simultaneously 102 at a different flip angle from those used in the initial acquisition. In a preferred embodiment, this flip angle may be twice or half the first flip angle used for each coil. Once all mapping data has been acquired, coil sensitivity profiles are mapped for each coil 104, as known in the art.

The MR mapping data acquired from each coil at the first flip angle and the MR mapping data acquired from all coils simultaneously are then fed to a neural network as a set of sample input values $(x_{ji})$ 106. The calculated sensitivity maps are fed to the network as the corresponding set of target outputs $(t_j)$ 108. The neural network is instructed to tune its weight function for the hidden level (or may do so automatically) 110 in accordance with the desired weight adjustment algorithm and associated features. If the network determines 112 that the weight function has been optimized 114, the training process ends 116. Otherwise, if the weight function has not yet been optimized 118, then the training process repeats 120. The number of repetitions will typically be proportionate to the dimensionality of the input matrix and target output matrix.

Figure 4:
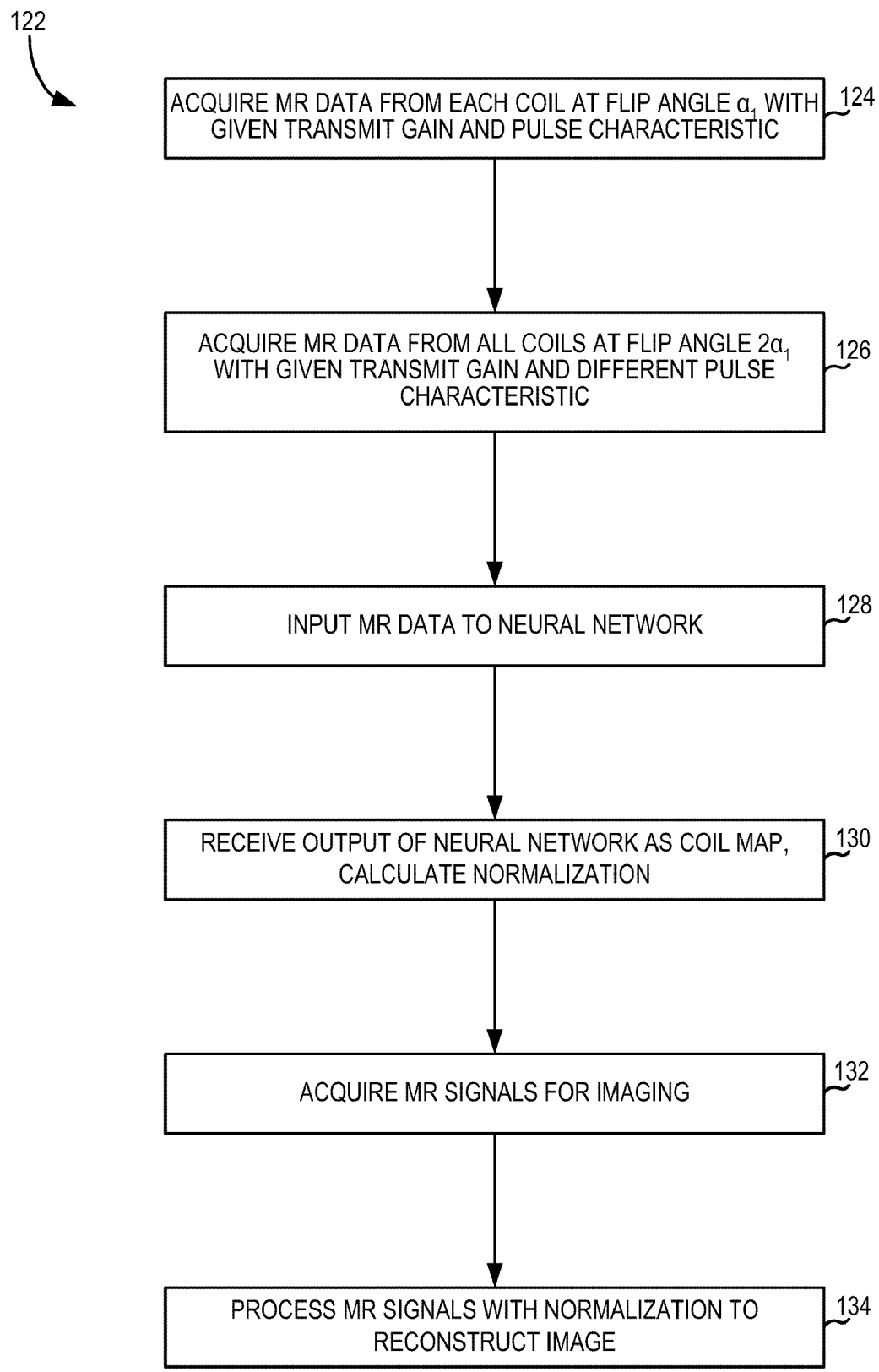
FIG. 4 is a flowchart representing a sensitivity mapping technique, used after the system is trained, in accordance with the present invention.

Referring now to FIG. 4, a technique 122 for using a fully-trained neural network (as achieved by the process of FIG. 3) to produce coil sensitivity maps for use in image reconstruction is shown. First, MR mapping data (e.g. low resolution data), is acquired 124 from each coil of an RF coil assembly with an RF pulse at a first flip angle, $\alpha_1$, and having a given transmit gain and a given RF wave characteristic, such as a particular amplitude or pulse width. MR mapping data may then be acquired 126 from all coils simultaneously at a second flip angle, $\alpha_2$. Preferably, the second flip angle is equal to double or half the first flip angle. This may be done by modifying the given RF wave amplitude or pulse width from the first set of acquisitions. However, any flip angle not equal to the first flip angle may be used for the second acquisition 126. Further, depending upon the degree of B1 inhomogeneity, the second acquisition 126 may be optional.

The MR mapping data acquired from the first set of acquisitions 124 and the second acquisition 126 are then fed to the trained neural network as input values 128. The neural network is caused to produce an output via its tuned weight function, which is received by a system control or other processing unit as a coil sensitivity map or set of sensitivity profiles 130. The sensitivity map may be used for image data normalization or tailoring specific coil currents. This process may take place in a significantly shorter time due to the reduced number of mapping data acquisitions and to the rapidity of neural network calculations.

An imaging process may take place in which higher resolution MR signals are acquired in a conventional manner 132. In a data processing or image reconstruction stage, the sensitivity map or normalization computed by the neural network may be applied to the MR signals 134 to compensate for the non-uniformities of the B1 field. Alternatively, a parallel imaging reconstruction may be performed based on the sensitivity map, or a pulse sequence (e.g. tailored currents for each coil to produce specific excitation pulses) may be designed for specific or narrow field of view imaging or other uses.

Alternatively, to speed up both the training and calculating functions of the neural network, a data dimensionality reduction procedure, such as a principal component analysis, may be used to reduce the dimensionality of the input and target output samples of the neural network, as well as the higher-resolution MR imaging inputs. As known in the art, a principal component analysis is a technique for reducing the expression of given datasets (such as images or sets of MR signals) to their variations from a number of basis sets. In other words, a number of datasets can be analyzed to factor out commonalities and major variations, which are expressed as a basis set. Then, each given dataset is reduced to a vector or matrix of its projection onto the basis set. The result is a significantly reduced way to express datasets which have similarities.

Therefore, a set of sample input data and target data may be reduced in dimensionality via principal component analysis before being used to train a neural network. Thus, the neural network may use fewer hidden nodes and fewer calculations to achieve a properly tuned weighting function, as described in FIG. 3. Consequently, in such embodiments the actual MR mapping data acquired in the technique of FIG. 4 will also be reduced via principal component analysis. When the neural network produces an output, the resulting vector or matrix can be expanded across a basis set to produce a full coil sensitivity map or normalization. Imaging processes can therefore be performed in a standard fashion.

Accordingly, in one embodiment of the present invention, a MR system includes a plurality of gradient coils, an RF coil assembly, a system control, and an image processing unit. The gradient coils are positioned about a bore of a magnet to impress a polarizing magnetic field therein. The RF coil assembly emits RF pulse sequences and receives resulting MR data from a subject within the bore. The system control is configured to develop a coil sensitivity mapping function from sample sets of MR data and determine a given coil sensitivity map which is applied by the imaging processing unit in an MR imaging procedure.

The present invention is also embodied in a method for sensitivity mapping of RF coils. The method includes training a neural network to determine sensitivity profiles, acquiring MR mapping data at a given transmit power and with a given RF pulse characteristic for each of a plurality of coils of an MR system, and inputting the MR mapping data to the neural network to obtain a coil sensitivity profile.

In accordance with another embodiment of the invention, a coil sensitivity generator is disclosed. The generator includes a processing unit that operates a neural network to produce B1 maps. A training data interface is connected to receive sample MR data and input the data to train the neural network. MR mapping signals are acquired by a data acquisition unit from each coil of an RF coil assembly and transmitted to the neural network.

The present invention has been described in terms of the preferred embodiment, and it is recognized that equivalents, alternatives, and modifications, aside from those expressly stated, are possible and within the scope of the appending claims.

What is claimed is:

1. An MR system comprising:
   a plurality of gradient coils positioned about a bore of a magnet to impress a polarizing field;
   an RF coil assembly connected to emit RF pulse sequences and arranged to receive MR data from a subject within the bore;
   a system control configured to develop a coil sensitivity mapping function from sample sets of MR data and determine a given coil sensitivity map, wherein the system control includes a neural network operating with a back propagation weight-tuning rule to develop and update the coil sensitivity mapping function; and
   an image processing unit configured to apply the given coil sensitivity map in an MR imaging procedure.

2. The MR system of claim 1 wherein the image processing unit is further configured to apply the given coil sensitivity map for at least one of parallel imaging or tailoring RF coil currents to create excitation profiles with desired characteristics.

3. The MR system of claim 1 wherein the coil sensitivity mapping function represents the operation of a desired number of hidden units in a desired number of layers of the neural network.

4. The MR system of claim 1 wherein the sample sets of MR data include sets of MR signals as inputs for the neural network and predetermined corresponding sensitivity maps as target outputs for the neural network.

5. The MR system of claim 1 wherein the RF coil assembly includes at least eight individual RF coils and at least eight independent transmit channels arranged for parallel imaging.

6. The MR system of claim 1 wherein the system control is further configured to cause the RF coil assembly to acquire mapping data at a given transmit power individually for each RF coil of the RF coil assembly.

7. The MR system of claim 6 wherein the system control is further configured to cause the RF coil assembly to acquire mapping data at the given transmit power with an RF pulse characteristic differing from the individual acquisitions, with all RF coils simultaneously.

8. The MR system of claim 5 wherein the system control is further configured to determine the given coil sensitivity map by inputting the mapping data to the coil sensitivity mapping function.

9. The MR system of claim 5 wherein the system control is further configured to perform a data dimensionality reduction procedure of the mapping data to reduce a dimensionality of an input to the coil sensitivity mapping function.

10. A method for sensitivity mapping of RF coils comprising:
    training a neural network to determine coil sensitivity profiles;
    acquiring MR mapping data at a given transmit power and with a given RF pulse characteristic for each of a plurality of coils of an MR system; and
    inputting the MR mapping data to the neural network to obtain a coil sensitivity profile for each coil.

11. The method of claim 10 further comprising acquiring additional MR mapping data at the given transmit power and with a different RF pulse characteristic with all the coils of the MR system simultaneously.

12. The method of claim 11 further comprising at least one of doubling an RF pulse amplitude, halving an RF pulse amplitude, changing an RF pulse width, and changing RF pulse height for acquisition of the additional MR mapping data.

13. The method of claim 10 further comprising designing the neural network to operate in a feed forward mode with back propagation.

14. The method of claim 13 wherein training the neural network includes causing the neural network to establish a set of weights in accordance with a gradient descent algorithm to apply to MR data sets to produce sensitivity maps.

15. The method of claim 10 wherein training the neural network includes acquiring sample MR sensitivity data for a number of training sets and feeding at least a portion of the sample MR sensitivity data to the neural network.

16. The method of claim 15 wherein training the neural network further includes calculating fits of signal intensity of the sample MR sensitivity data versus flip angle and feeding the fits to the neural network.

17. The method of claim 15 wherein feeding the mapping data includes performing a principal component analysis of the sample MR sensitivity data and inputting a result thereof to the neural network.

18. The method of claim 17 wherein training the neural network includes acquiring sample MR sensitivity data for a reduced number of training sets proportional to a dimensionality of the result of the principle component analysis.

19. The method of claim 10 further comprising at least one of applying the coil sensitivity profile to MR data for image reconstruction and designing a specific field of view excitation sequence using the coil sensitivity profile.

20. A coil sensitivity map generator comprising:
    a processing unit programmed to operate a neural network to produce B1 maps;
    a training data interface connected to receive sample MR data and input the sample MR data to train the neural network;
    a data acquisition unit configured to acquire MR mapping signals from each coil of an RF coil assembly and transmit the signals to the neural network.

21. The coil sensitivity map generator of claim 20 wherein the neural network is configured to tune a set of coefficients via a back-propagation weight-adjustment function.

22. The coil sensitivity map generator of claim 20 further comprising a principal component analyzer programmed to determine a basis set of prototype MR mapping signals and describe the MR mapping signals acquired from the RF coils by projections on the basis set.

23. The coil sensitivity map generator of claim 20 further comprising acquiring additional MR mapping signals from all coils of the RF coil assembly simultaneously.

24. The coil sensitivity map generator of claim 20 wherein the data acquisition unit is further configured to acquire the MR mapping signals from each coil of the RF coil assembly at a given flip angle.

25. The coil sensitivity map generator of claim 20 wherein the sample MR data includes a number of sets of MR data acquired at a plurality of flip angles and a corresponding number of predetermined B1 maps.

* * * * *